(12) United States Patent
Kim

(10) Patent No.: US 7,301,371 B2
(45) Date of Patent: Nov. 27, 2007

(54) TRANSMITTER OF A SEMICONDUCTOR DEVICE

(75) Inventor: Jin-Hyun Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 135 days.

(21) Appl. No.: 11/221,282

(22) Filed: Sep. 6, 2005

(65) Prior Publication Data

US 2006/0050571 A1    Mar. 9, 2006

(30) Foreign Application Priority Data

Sep. 7, 2004    (KR) .................. 10-2004-0071223

(51) Int. Cl.
*H03K 19/0175* (2006.01)
*H03K 19/094* (2006.01)
*H03K 19/20* (2006.01)

(52) U.S. Cl. ................ 326/82; 326/80; 326/83; 326/85; 326/86; 326/87; 326/112; 326/115; 326/126; 326/127; 327/108; 327/109

(58) Field of Classification Search ............ 326/62–68, 326/80–87, 112, 115, 126, 127; 327/108, 327/109
See application file for complete search history.

(56) References Cited

U.S. PATENT DOCUMENTS

| | | | | |
|---|---|---|---|---|
| 3,845,404 A | * | 10/1974 | Trilling ................ | 330/69 |
| 5,798,664 A | * | 8/1998 | Nagahori et al. ........ | 327/307 |
| 5,838,197 A | * | 11/1998 | Tsukuda .................. | 330/252 |
| 6,061,192 A | * | 5/2000 | Ogiwara ................. | 360/46 |
| 6,288,604 B1 | * | 9/2001 | Shih et al. ............... | 330/9 |
| 6,356,106 B1 | | 3/2002 | Greeff et al. | |

(Continued)

FOREIGN PATENT DOCUMENTS

KR    10-0232317    9/1999

(Continued)

OTHER PUBLICATIONS

English language abstract of Korean Publication No. 10-0232317 Sep. 4, 1999.

(Continued)

*Primary Examiner*—Rexford Barnie
*Assistant Examiner*—Dylan White
(74) *Attorney, Agent, or Firm*—Marger Johnson & McCollom, P.C.

(57) ABSTRACT

Embodiments of the present invention provide a transmitter of a semiconductor device, which can output signals corresponding to input signals having various common mode levels and amplitudes. The transmitter may include a pre-driver unit, main driver unit, and a control circuit. The pre-driver unit modifies a common mode level and the amplitude of first internal output signals to generate internal output signals in response to driver control signals. The main driver unit modifies the common mode level and the amplitude of the second internal output signals. The control circuit detects the common mode level and the amplitude of a connected circuit. The common mode level and the amplitude of the output signals may then automatically be adjusted to be the same as the common mode level and the amplitude of this connected circuit High speed signal conditioning may be accomplished.

39 Claims, 10 Drawing Sheets

U.S. PATENT DOCUMENTS

| | | | |
|---|---|---|---|
| 6,392,443 B1 * | 5/2002 | Gauthier | 326/86 |
| 6,396,329 B1 * | 5/2002 | Zerbe | 327/336 |
| 6,411,145 B1 * | 6/2002 | Kueng et al. | 327/175 |
| 6,459,306 B1 * | 10/2002 | Fischer et al. | 327/67 |
| 6,507,241 B1 * | 1/2003 | Ritter | 330/9 |
| 6,522,179 B2 * | 2/2003 | Ferianz | 327/108 |
| 6,570,931 B1 * | 5/2003 | Song | 375/295 |
| 6,710,645 B2 * | 3/2004 | Isken et al. | 330/9 |
| 6,720,827 B2 * | 4/2004 | Yoon | 330/85 |
| 6,844,766 B2 * | 1/2005 | Sun | 327/284 |
| 6,856,195 B2 * | 2/2005 | Ranmuthu | 330/86 |
| 6,903,593 B2 * | 6/2005 | Wang | 327/307 |
| 6,933,762 B2 * | 8/2005 | Ono | 327/307 |
| 6,977,534 B2 * | 12/2005 | Radelinow | 327/112 |
| 6,980,022 B1 * | 12/2005 | Shumarayev et al. | 326/30 |
| 6,992,526 B2 * | 1/2006 | Cheng | 330/9 |
| 7,095,667 B2 * | 8/2006 | Baker | 365/207 |
| 2002/0153936 A1 * | 10/2002 | Zerbe | 327/336 |
| 2004/0080336 A1 * | 4/2004 | Hirano | 326/30 |
| 2004/0137676 A1 | 7/2004 | Kim et al. | |
| 2005/0134313 A1 * | 6/2005 | Kim | 326/86 |
| 2006/0061405 A1 * | 3/2006 | Zerbe | 327/336 |

FOREIGN PATENT DOCUMENTS

KR     10-0272671     8/2000

OTHER PUBLICATIONS

English language abstract of Korean Publication No. 10-0272671 Aug. 28, 2000.

* cited by examiner (1) TMDS (2) HVDS (3) LVDS

FIG. 8

| CONTROL SIGNAL OF PRE-DRIVER UNIT | | | | | CONTROL SIGNAL OF MAIN DRIVER UNIT | | | | | SIGNALING SYSTEM |
|---|---|---|---|---|---|---|---|---|---|---|
| Vpp | Vpn | Vppn | Vpb<3:5> | Vnb<3:5> | Vp | Vn | Vpn | Vpb<0:2> | Vnb<0:2> | |
| L | L | H | H H H | H L L | L | L | H | H H H | H X X | TMDS |
| L | H | L | L H H | H L L | H | H | H | H X X | L L L | LVDS |
| L | H | L | L H H | H L L | L | H | L | L X X | H X X | HVDS |
| L | H | L | L L H | H H L | L | H | L | L X X | L L L | H_HVDS |
| L | H | L | L L H | H H L | L | H | L | H H H | H X X | L_HVDS |

# TRANSMITTER OF A SEMICONDUCTOR DEVICE

BACKGROUND OF THE INVENTION

This application claims the benefit of Korean Patent Application No. 2004-0071223, filed on Sep. 7, 2004, in the Korean Intellectual Property Office, the disclosure of which is incorporated herein in its entirety by reference.

1. Field of the Invention

The present invention relates to a semiconductor device, and more particularly, to a transmitter of a semiconductor device that can adjust and output signals to match the common mode level and amplitude of a connected circuit.

2. Description of the Related Art

FIG. 1 is a block diagram of a system including a conventional multi-port multimedia semiconductor device.

Referring to FIG. 1, the system 100 includes a first circuit block 110, a second circuit block 160, and a multi-port multimedia semiconductor device 140.

The semiconductor device 140 may be, for example, a memory device such as a DRAM. The semiconductor device 140 employs a specific signaling system for data communication with the first and second circuit blocks 110 and 160. An example of the data communication is disclosed in U.S. Patent Publication No. 2004/0137676, and the signaling system is defined by a direct current (DC) (or average) level and amplitude (or swing range) based on the DC level. The DC level is called as a common mode level.

To transmit data between the semiconductor device 140 and the first and second circuit blocks 110 and 160 at a high speed, the semiconductor device 140 and circuits of the first and second circuit blocks 110 and 160 include additional input/output (I/O) circuits 114, 115, 116, 118, 120, 141 through 148, and 161 through 164, which appropriately convert the signaling system of a connected I/O circuit to the signaling system of the semiconductor device 140 or the first or second circuit blocks 110 or 160. Each of the I/O circuits 114, 115, 116, 118, 120, 141 through 148, and 161 through 164 includes a transmitter (or an output buffer) and/or a receiver (or an input buffer).

The first circuit block 110 includes an audio input circuit 111, a video input circuit 112, a digital media processing circuit 113, an audio output circuit 117, and a video output circuit 119.

The audio input circuit 111 processes an audio input signal Ain and transmits the processed audio input signal to the I/O circuit 141 of the semiconductor device 140. The I/O circuit 141 converts the processed audio signal into a signal having the common mode level and the amplitude used by the semiconductor device 140.

The video input circuit 112 processes a video input signal Vin and transmits the processed video input signal to the I/O circuit 141 of the semiconductor device 140. The I/O circuit 141 converts the processed video signal into a signal having the common mode level and the amplitude used by the semiconductor device 140.

The digital media processing circuit 113 transmits/receives signals to/from the I/O circuits 141, 142 and 143 of the semiconductor device 140 via the I/O circuits 114, 115 and 116.

The audio output circuit 117 converts the common mode level and the amplitude of the signal transmitted from the I/O circuit 144 of the semiconductor device 140 using the external I/O circuit 118 and processes the signal having the converted common mode level and amplitude to output the signal as an audio output signal Aout.

The video output circuit 119 converts the common mode level and the amplitude of the signal transmitted from the I/O circuit 144 of the semiconductor device 140 using the internal I/O circuit 120 and processes the signal having the converted common mode level and amplitude to output the signal as a video output signal Vout.

The second circuit block 160 may be a circuit block having elements similar to the elements of the first circuit block 110, a memory device, or a memory controller. The second circuit block 160 includes the I/O circuits 161 through 164 used in communications with the I/O circuits 145 through 148 of the semiconductor device 140.

As described above, to transmit signals between the semiconductor device 140 and the first and second circuit blocks 110 and 160 at a high speed, additional I/O circuits converting a signaling system are required. Such additional I/O circuits may increase the cost of the entire system. Also, the number of additional I/O circuits is increased according to an increase in the number of circuits of the first and second circuit blocks 110 and 160, thereby increasing the cost of the system.

SUMMARY OF THE INVENTION

Embodiments of the present invention provide a transmitter of a semiconductor device, which can adjust and output signals to match the common mode level and amplitude of a connected circuit.

BRIEF DESCRIPTION OF THE DRAWINGS

The above and other features and advantages of the present invention will become more apparent by describing in detail exemplary embodiments thereof with reference to the attached drawings in which:

FIG. 8 is a table indicating signaling systems corresponding to combinations of control signals of the pre-driver unit and the main driver unit shown in FIG. 4;

DETAILED DESCRIPTION OF THE INVENTION

Figure 1:
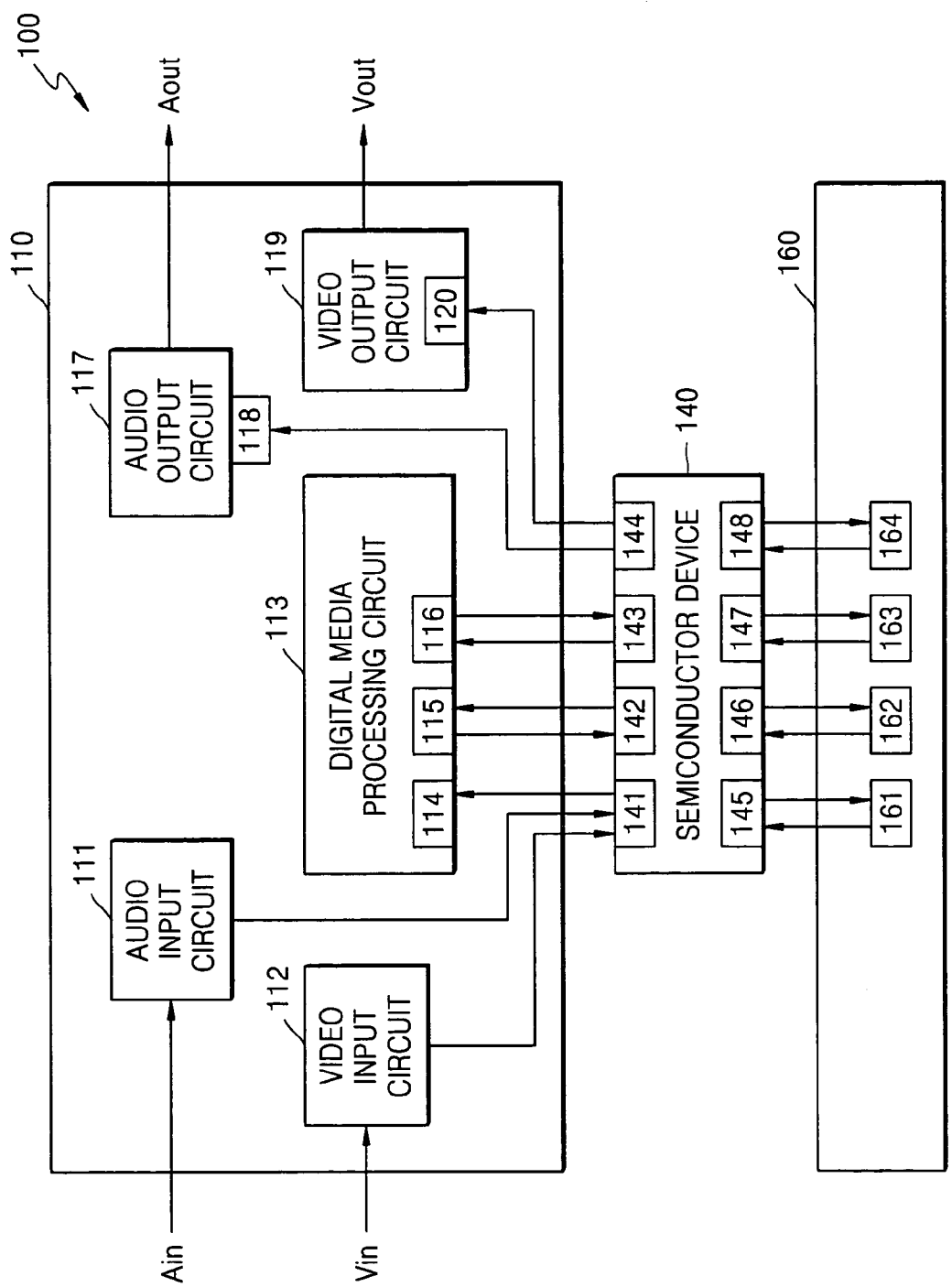
FIG. 1 is a block diagram of a system including a conventional multi-port multimedia semiconductor device.

The attached drawings for illustrating preferred embodiments of the present invention are referred to in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

Figure 2:
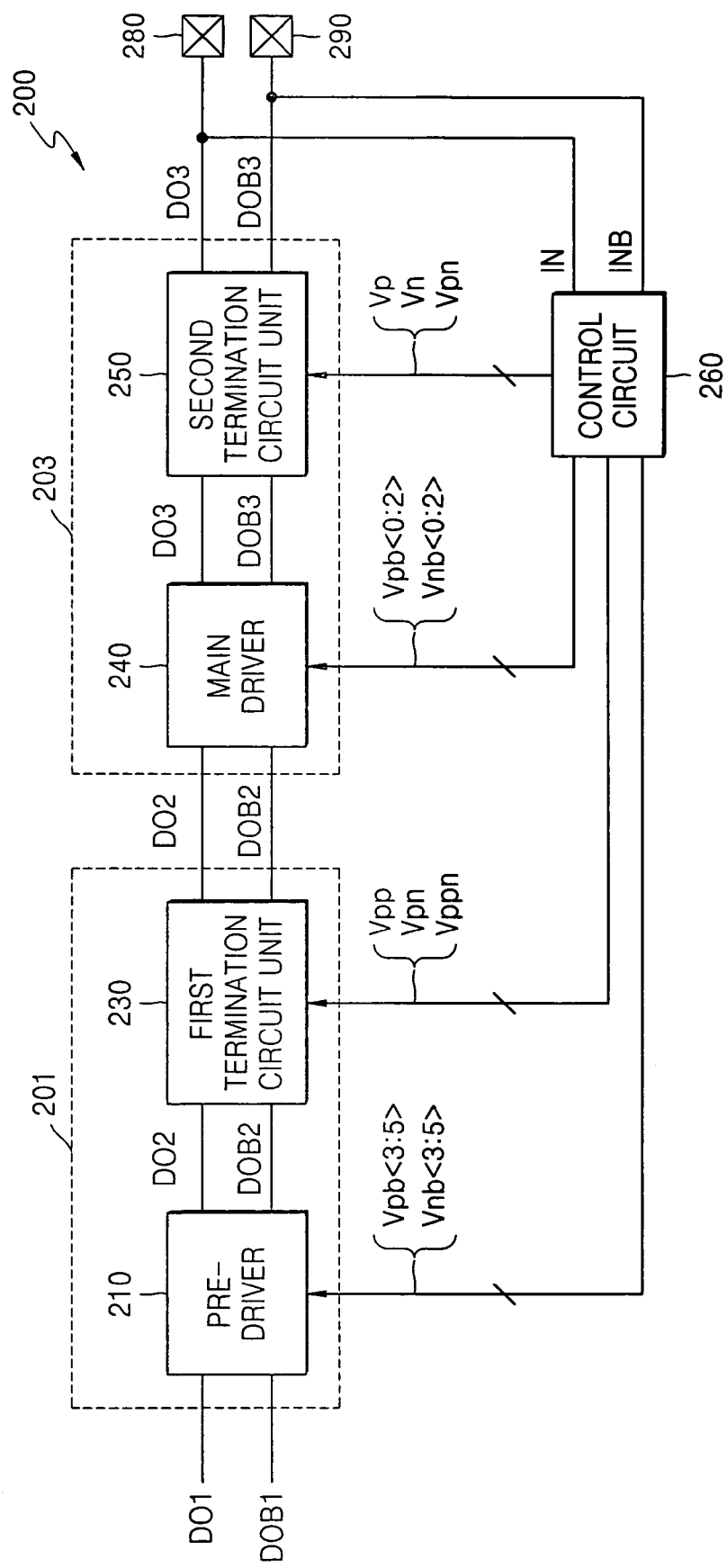
FIG. 2 is a block diagram of a transmitter of a semiconductor device according to an embodiment of the present invention.

FIG. 2 is a block diagram of a transmitter 200 of a semiconductor device according to an embodiment of the present invention.

Referring to FIG. 2, the transmitter 200 includes a pre-driver 210, a first termination circuit unit 230, a main driver 240, a second termination circuit unit 250, and a control circuit 260. The transmitter 200 is an output buffer (or an output driver) and can be one of a plurality of input/output (I/O) circuits of a semiconductor device shown in FIG. 1. The transmitter 200 may also be a transmitter included in a memory device such as a DRAM.

The control circuit 260 detects the common mode level and the amplitude of differential input mode signals IN and INB input via DQ pads 280 and 290 and generates first and second driver control signals [Vpb<3:5> and Vnb<3:5>] and [Vpb<0:2> and Vnb<0:2>], and first and second termination control signals [Vpp, Vpn, and Vppn] and [Vp, Vn, and Vpn].

Figure 3:
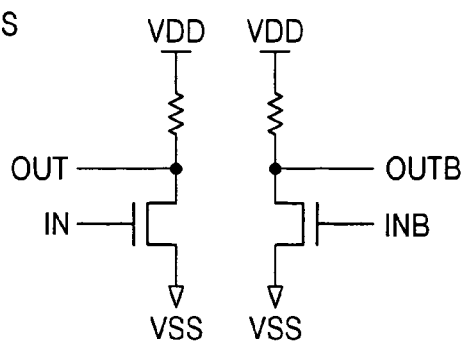
FIG. 3 illustrates examples of signaling systems which can be inputted/outputted via DQ pads shown in FIG. 2 and output drivers corresponding to the signaling systems.
Figure 3:
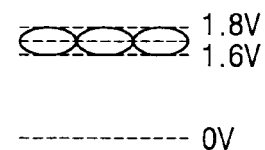
Figure 3:
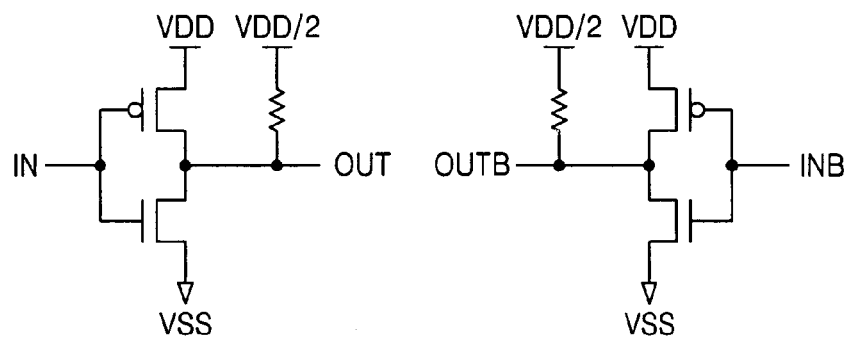
Figure 3:
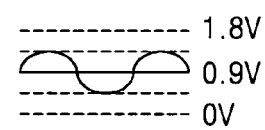
Figure 3:
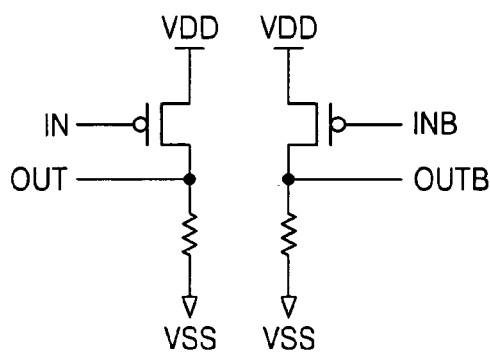
Figure 3:
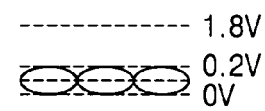

FIG. 3 illustrates examples of a signaling system which can be input/output via the DQ pads 280 and 290 shown in FIG. 2 and output drivers corresponding to the signaling systems.

In transition minimized differential signaling (TMDS), I/O signals may have an amplitude swing of 0.1 V about a common mode level of 1.7 V.

In half voltage differential signaling (HVDS), I/O signals may have an amplitude swing of 0.1 V about a common mode level of 0.9 V.

In low voltage differential signaling (LVDS), I/O signals may have an amplitude swing of 0.1 V about a common mode level of 0.1 V.

Referring to FIG. 2, in response to the first and second driver control signals [Vpb<3:5 and Vnb<3:5>] and [Vpb<0:2> and Vnb<0:2>] and the first and second termination control signals [Vpp, Vpn, and Vppn] and [Vp, Vn, and Vpn], the common mode level and the amplitude of output signals DO3 and DOB3 are identical to the common mode level and amplitude of the corresponding input signals IN and INB. In this way, the transmitter 200 detects the common mode level and amplitude of a connected circuit to adjust and output matching signals.

In an embodiment of the present invention, the number of the first and second driver control signals [Vpb<3:5 and Vnb<3:5>] and [Vpb<0:2> and Vnb<0:2>] is 12, and the number of the first and second termination control signals [Vpp, Vpn, and Vppn] and [Vp, Vn, and Vpn] is 6. When more signaling systems of the input mode signals IN and INB are used, the number of the first and second driver control signals and the number of the first and second termination control signals are increased. For example, an additional signaling system may be a rambus signal level (RSL) with a common mode level of 1.4 V and an amplitude swing of 0.4 V.

A pre-driver unit 201 comprises the pre-driver 210 and the first termination circuit unit 230, and a main driver unit 203 comprises the main driver 240 and the second termination circuit unit 250.

In response to the first driver control signals [Vpb<3:5> and Vnb<3:5>], the pre-driver 210 modifies common mode levels and amplitudes of first internal output signals DO1 and DOB1 and outputs second internal output signals DO2 and DOB2. The first and second internal output signals DO1, DOB1, DO2, and DOB2 are differential signals.

The first termination circuit unit 230 sets a termination voltage which is supplied to signal lines transferring the second internal output signals DO2 and DOB2 in response to the first termination control signals Vpp, Vpn, and Vppn. The termination voltage may be VDD, VDD/2, or VSS. Here, VDD is a power supply voltage, and VSS is a ground voltage. The power supply voltage VDD may be 1.8 V.

The first internal output signals DO1 and DOB1 may have small amplitude swings according to the common mode level below the power supply voltage VDD. The pre-driver unit 201 can control the common mode level and the amplitude of the first internal output signals DO1 and DOB1 so that the common mode level of the second internal output signals DO2 and DOB2 is 2VDD/3, VDD/2, or VDD/3.

In response to the second driver control signals Vpb<0:2> and Vnb<0:2>, the main-driver 240 modifies the common mode level and the amplitude of the second internal output signals DO2 and DOB2 to output signals DO3 and DOB3. The output signals DO3 and DOB3 are differential signals. The output signals DO3 and DOB3 are output to external apparatuses via the DQ pads 280 and 290. The external apparatuses may be first and second circuit blocks 110 and 160 shown in FIG. 1.

The second termination circuit unit 250 sets a termination voltage supplied to signal lines transferring the output signals DO3 and DOB3 in response to the second termination control signals Vp, Vn, and Vpn. The termination voltage may be VDD, VDD/2, or VSS.

The main driver unit 203 sets a voltage gain of the main driver 240 to satisfy the signaling systems of external apparatuses, changes the common mode level of the output signals DO3 and DOB3, and controls the amplitude of the output signals DO3 and DOB3.

For example, when a signaling system is TMDS used in an extreme data rate (XDR) DRAM, the pre-driver unit 201 and the main driver unit 203 are set to TMDS. When a signaling system is HVDS used in a double data rate DRAM, the pre-driver unit 201 and the main driver unit 203 are set to HVDS. When a signaling system is LVDS, the pre-driver unit 201 is set to HVDS and the main driver unit 203 is set to LVDS.

Accordingly, the transmitter 200 of a semiconductor device can output an output signal having the same common mode level and amplitude as a circuit to which it is connected by detecting the common mode level and amplitude among a number of possibilities of the circuit. The detected common mode level and amplitude is supplied to the transmitter 200 as the input mode signals IN and INB. Therefore, any external apparatus communicating with the transmitter 200 does not require additional I/O circuits (for example, 118 and 120 of FIG. 1). Also, since the transmitter 200 includes the control circuit 260, which generates stable control signals, the output signals DO3 and DOB3 are not sensitive to power noise.

Figure 4:
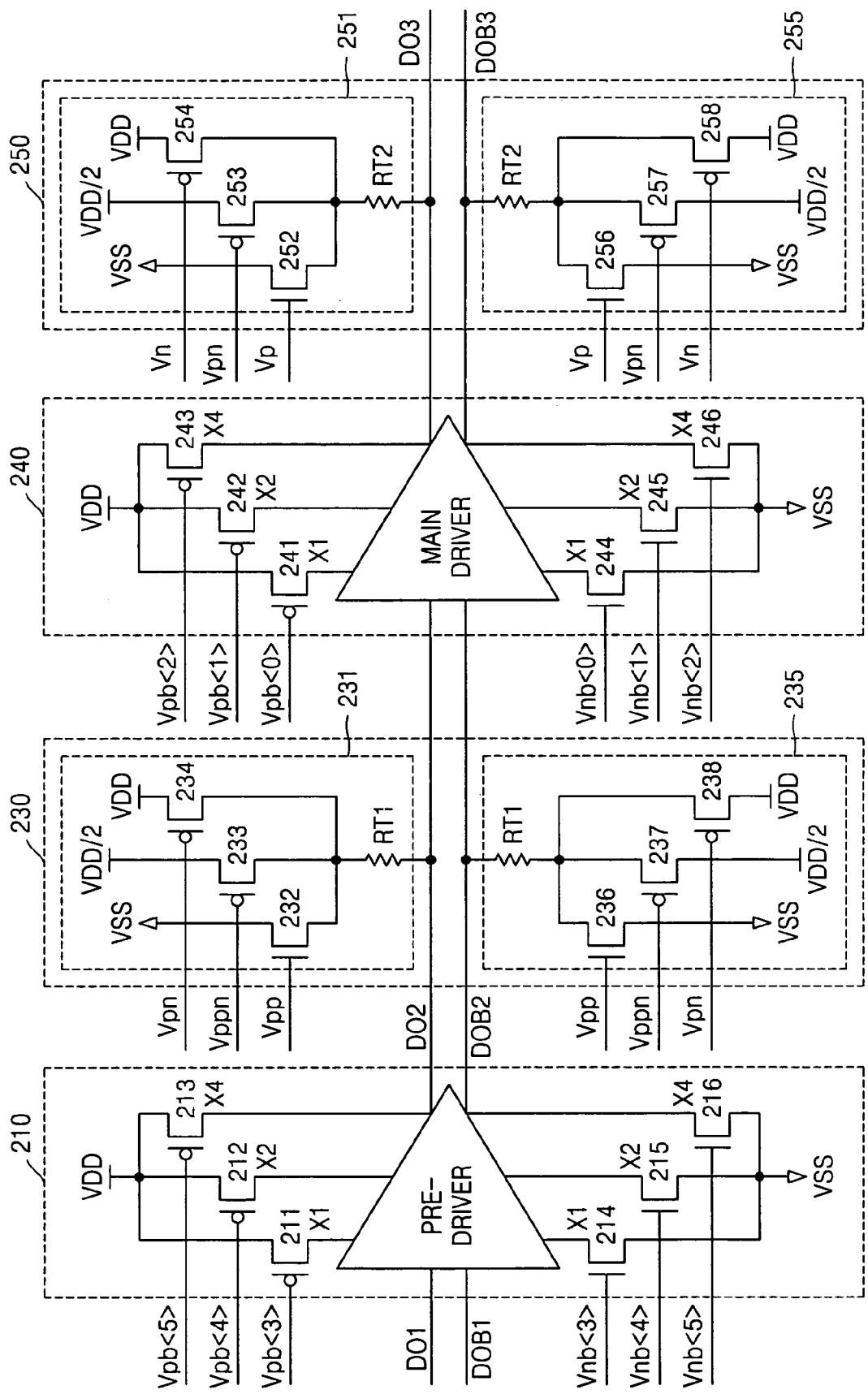
FIG. 4 is a circuit diagram of a pre-driver unit and a main driver unit shown in FIG. 2.

FIG. 4 is a circuit diagram of the pre-driver unit 201 and the main driver unit 203 shown in FIG. 2.

The pre-driver 210 includes PMOS transistors 211 through 213 having sources connected to a power supply voltage VDD and NMOS transistors 214 through 216 having sources connected to a ground voltage VSS.

When the βratio of the PMOS transistor 211, namely, the ratio of the width of a channel to the length of the channel, is 1(X1), the βratio of the PMOS transistor 212 may be 2(X2) and the βratio of the PMOS transistor 213 may be 4(X4). However, the βratios of the PMOS transistors 211 through 213 are not limited thereto, in the present embodiment.

Pull-up signals Vpb<3 >, Vpb<4 >, and Vpb<5 > of the first driver control signals are inputted to gates of the PMOS transistors 211 through 213, respectively.

For an embodiment, if the βratio of the NMOS transistor 214 is 1(X1), the βratio of the NMOS transistor 215 may be 2(X2) and the βratio of the NMOS transistor 216 may be 4(X4). However, the βratios of the NMOS transistors 214 through 216 are not limited thereto.

Pull-down signals Vnb<3>, Vnb<4>, and Vnb<5> of the first driver control signals are inputted to gates of the NMOS transistors 214 through 216, respectively.

Currents that flow through the sources 211 through 216 are controlled based on the first driver control signals [Vpb<3>, Vpb<4>, and Vpb<5>] and [Vnb<3>, Vnb<4, and Vnb<5>], respectively. Accordingly, when the currents that flow through the sources 211 through 216 are controlled, the common mode level and the amplitude swings of the second internal output signals DO2 and DOB2 can be controlled.

The voltages of the first driver control signals [Vpb<3 >, Vpb<4 >, and Vpb<5 >] and [Vnb<3>, Vnb<4>, and Vnb<5>] must be greater than a predetermined value, for example, 0.2 V, so that the sources 211 through 216 can stably operate in a saturation region.

Figure 5:
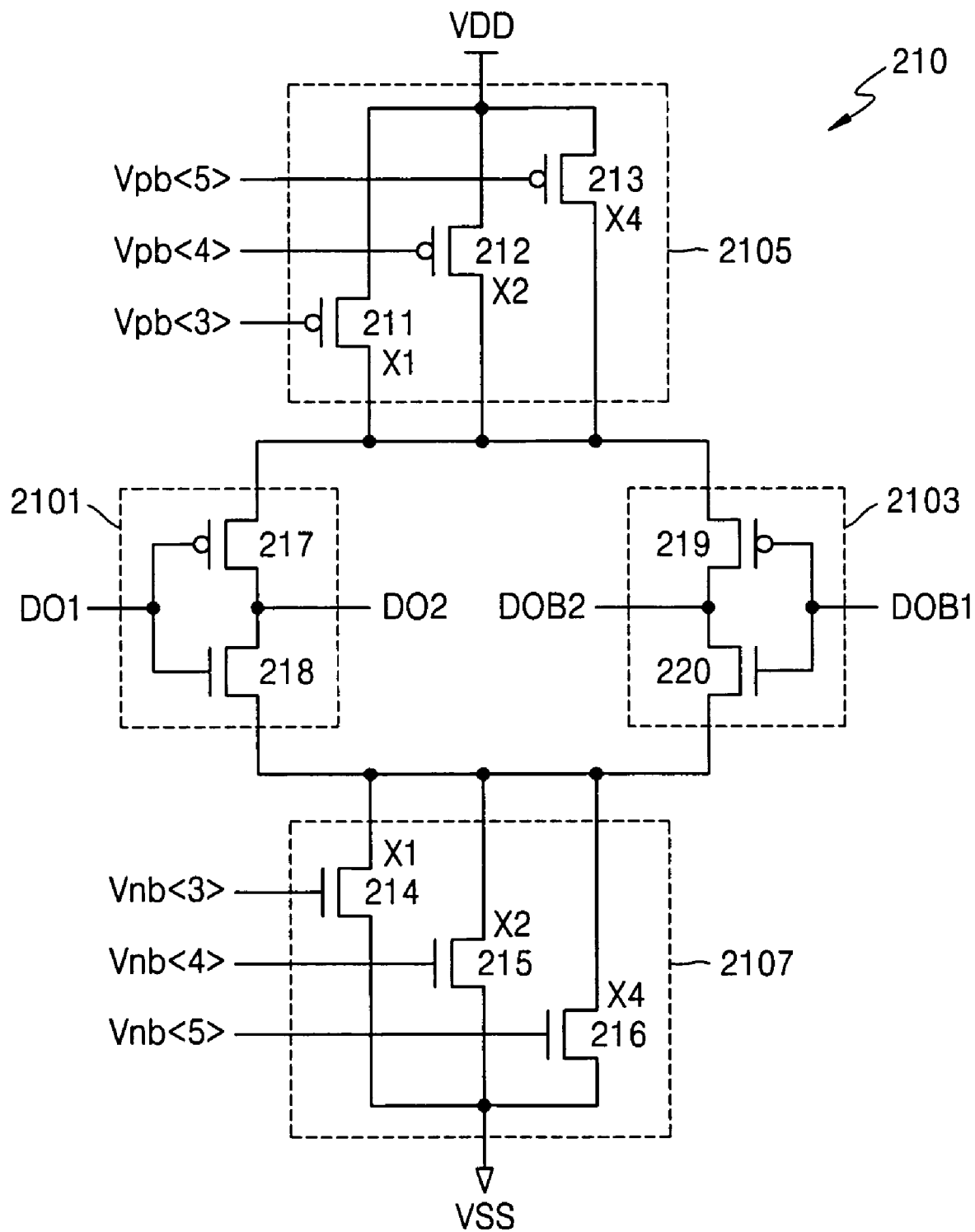
FIG. 5 is a circuit diagram of a pre-driver shown in FIG. 4.

FIG. 5 is a circuit diagram of the pre-driver 210 of FIG. 4.

The pre-driver 210 includes an output unit 2101, a complementary output unit 2103, a pull-up transistor unit 2105, and a pull-down transistor unit 2107.

The output unit 2101 inverts the first internal output signal DO1 and outputs the second internal output signal DO2. The first internal output signal DO1 is inputted to gates of a PMOS transistor 217 and an NMOS transistor 218. The second internal output signal DO2 is output from a node between the PMOS transistor 217 and NMOS transistor 218.

The complementary output unit 2103 inverts a complementary signal DOB1 of the first internal output signal DO1 and outputs a complementary signal DOB2 of the second internal output signal DO2. The complementary signal DOB1 of the first internal output signal DO1 is input to the gates of a PMOS transistor 219 and an NMOS transistor 220. The complementary signal DOB2 of the second internal output signal DO2 is outputted from a node between the PMOS transistor 219 and the NMOS transistor 220.

In response to the pull-up signals Vpb<3>, Vpb<4>, and Vpb<5> of the first driver control signals, the pull-up transistor unit 2105 supplies the power supply voltage VDD or a first voltage which is lower than the power supply voltage VDD to the output unit 2101 and the complementary output unit 2103. The pull-up transistor unit 2105 includes the three PMOS transistors 211, 212, and 213. The PMOS transistors 211, 212, and 213 include sources connected to the power supply voltage VDD and gates to which the pull-up signals Vpb<3>, Vpb<4>, and Vpb<5> are respectively input.

In response to the pull-down signals Vnb<3>, Vnb<4>, and Vnb<5> of the first driver control signals, the pull-down transistor unit 2107 supplies the ground voltage VSS or a second voltage which is greater than the ground voltage VSS to the output unit 2101 and the complementary output unit 2103. The pull-down transistor unit 2107 includes the three NMOS transistors 214, 215, and 216. The NMOS transistors 214, 215, and 216 include sources connected to the ground voltage VSS and gates to which the pull-down signals Vnb<3>, Vnb<4>, and Vnb<5> are respectively input.

Referring to FIG. 4, the first termination circuit unit 230 includes a first termination circuit 231 and a first complementary termination circuit 235.

In response to the first termination control signals Vpn, Vppn, and Vpp, the first termination circuit 231 supplies a termination voltage to a signal line transferring the second internal output signal DO2 via a termination resistor RT1. The termination voltage is VSS, VDD/2, or VDD.

The first termination circuit 231 includes an NMOS transistor 232, PMOS transistors 233 and 234, and the termination resistor RT1. The NMOS transistor 232 includes a source which is connected to VSS, a gate to which the first termination control signal Vpp is input, and a drain which is connected to a terminal end of the termination resistor RT1. The first PMOS transistor 233 has its source connected to VDD/2, its gate connected to the first termination control signal, Vppn, and its drain connected to the terminal of the termination resistor RT1. The second PMOS transistor 234 has a source connected to VDD, a gate connected to the first termination control signal, Vpn, and a drain connected to the terminal of the termination resistor RT1.

The voltage of each of the first termination control signals Vpn, Vppn, and Vpp must be over a predetermined value, for example, 0.2 V, so that the transistors 232 through 234 stably operate in a saturation region.

The first complementary termination circuit 235 supplies a termination voltage to a signal line transferring the complementary signal DOB2 of the second internal output signal DO2 via a termination resistor RT1. The termination voltage is VSS, VDD/2, or VDD.

The first complementary termination circuit 235 includes an NMOS transistor 236, PMOS transistors 237 and 238, and the termination resistor RT1. Since the first complementary termination circuit 235 has the same configuration as the first termination circuit 231, the description thereof will be omitted.

The main driver 240 includes PMOS transistors 241 through 243 whose sources are connected to VDD and NMOS transistors 244 through 246 whose sources are connected to VSS.

If the βratio of the PMOS transistor 241 is 1(X1), the βratio of the PMOS transistor 242 may be 2(X2) and the βratio of the PMOS transistor 243 may be 4(X4). However, the βratios of the PMOS transistors 241 through 243 are not limited thereto.

Pull-up signals Vpb<0>, Vpb<1>, and Vpb<2> of the second driver control signals are input to gates of the PMOS transistors 241 through 243, respectively.

If the βratio of the NMOS transistor 244 is 1(X1), the βratio of the NMOS transistor 245 may be 2(X2) and the βratio of the NMOS transistor 246 may be 4(X4). However, the βratios of the NMOS transistors 244 through 246 are not limited thereto.

Pull-down signals Vnb<0>, Vnb<1>, and Vnb<2> of the second driver control signals are input to gates of the NMOS transistors 244 through 246, respectively.

Currents that flow through the sources 241 through 246 are controlled based on the second driver control signals [Vpb<0>, Vpb<1>, and Vpb<2>] and [Vnb<0>, Vnb<1>, and Vnb<2>], respectively. Accordingly, when the currents that flow through the current sources 241 through 246 are controlled, common mode levels and amplitude swings of the output signals DO3 and DOB3 can be controlled.

The voltage of each of the second driver control signals must be greater than a predetermined value, for example, 0.2 V, so that the current sources 241 through 246 stably operate in a saturation region.

The main driver 240 further includes the elements 217, 218, 219 and 220 of the pre-driver 210 shown in FIG. 5. In this case, DO2 and DOB2 are used as input signals instead of DO1 and DOB1, and DO3 and DOB3 are used as output signals instead of DO2 and DOB2.

The second termination circuit unit 250 includes a second termination circuit 251 and a second complementary termination circuit 255. The second termination circuit 251 supplies a termination voltage to the signal line transferring the output signal DO3 via a termination resistor RT2. The termination voltage is VSS, VDD/2, or VDD.

The second termination circuit 251 includes an NMOS transistor 252, PMOS transistors 253 and 254, and a termination resistor RT2. The NMOS transistor 252 includes a source connected to VSS, a gate to which the second termination control signal Vp is input, and a drain connected to a terminal of the termination resistor RT2. The first PMOS transistor 253 includes a source connected to VDD/2, a gate to which the second termination control signal Vpn is input, and a drain connected to the terminal of the termination resistor RT2. The second PMOS transistor 254 includes a source connected to VDD, a gate to which the second termination control signal Vn is input, and a drain connected to the terminal of the termination resistor RT2.

The voltage of each of the second termination control signals must be greater than a predetermined value, for example, 0.2 V, so that each of the transistors 252 through 254 stably operates in a saturation region.

The second complementary termination circuit 255 supplies a termination voltage to the signal line transferring the complementary signal DOB3 of the output signal DO3 via a termination resistor RT2. The termination voltage is VSS, VDD/2, or VDD.

The second complementary termination circuit 255 includes an NMOS transistor 256, PMOS transistors 257 and 258, and the termination resistor RT2. Since the second complementary termination circuit 255 has the same configuration as the second termination circuit 251, the description of the configuration of the second complementary termination circuit 255 will be omitted.

Figure 6:
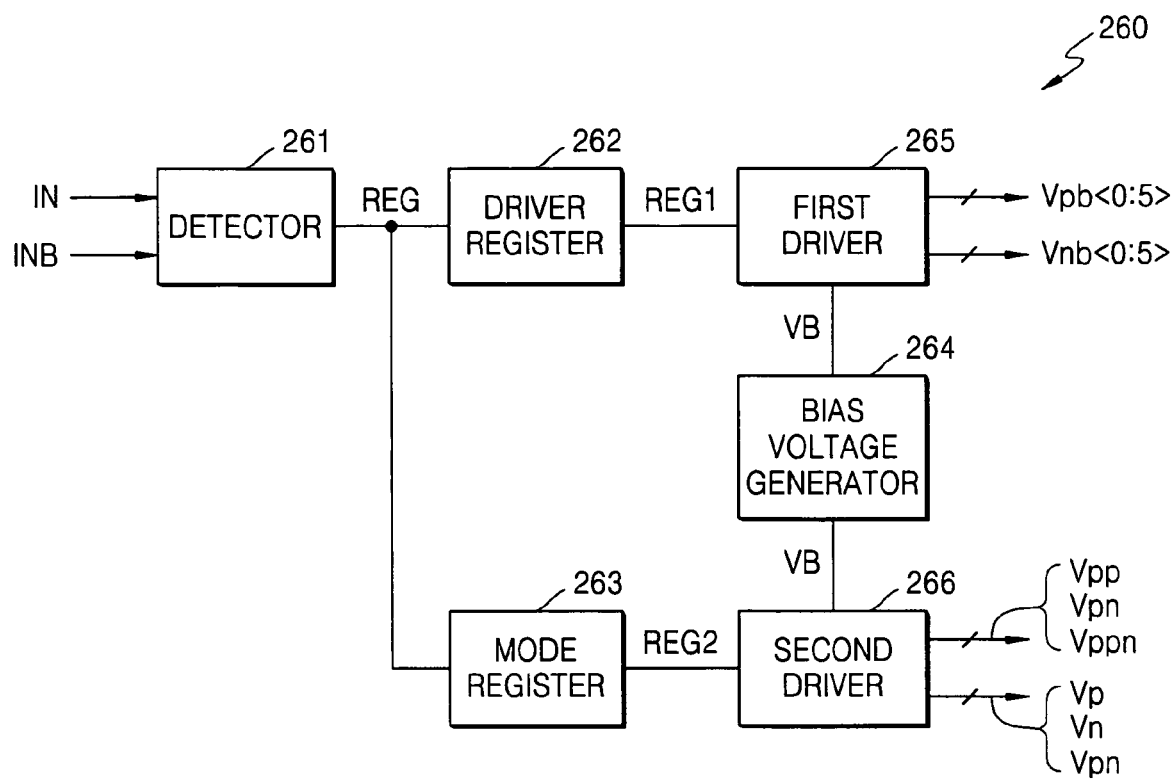
FIG. 6 is a block diagram of a control circuit shown in FIG. 2.

FIG. 6 is a block diagram of the control circuit 260 for the embodiment illustrated in FIG. 2.

Referring to FIG. 6, the control circuit 260 includes a detector 261, a driver register 262, a mode register 263, a bias voltage generator 264, a first driver 265, and a second driver 266.

The detector 261 detects the common mode level and the amplitude of the input mode signals IN and INB and generates a register signal REG which is a digital signal. Referring to FIG. 2, when the number of the first and second driver control signals Vpb<0:5> and Vnb<0:5> is 12 and the number of the first and second termination control signals [Vpp, Vpn, and Vppn] and [Vp, Vn, and Vpn] is 6, the register signal REG is an 18-bit digital signal.

The driver register 262 stores a first register signal REG1, which is a part of the register signal REG. When the register signal REG is an 18-bit digital signal, the first register signal REG1 is a 12-bit digital signal. The stored first register signal REG1 is used for generating driver control signals controlling the pre-driver and the main-driver.

The mode register 263 stores a second register signal REG2, which is another part of the register signal REG. When the register signal REG is an 18-bit digital signal, the second register signal REG2 is a 6-bit digital signal. The stored second register signal REG2 is used for generating termination control signals controlling the first termination circuit unit and the second termination circuit unit.

The bias voltage generator 264 generates a bias voltage which is used as a logic high voltage. For example, the bias voltage may be 0.9 V or 1.2 V.

The first driver 265 generates the driver control signals Vpb<0:5> and Vnb<0:5> in response to the first register signal REG1 and the bias voltage. The first driver 265 includes a plurality of inverters.

Figure 7:
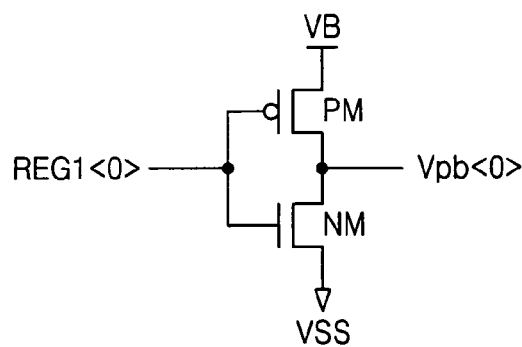
FIG. 7 is a circuit diagram of an inverter included in a first driver shown in FIG. 6.

FIG. 7 is a circuit diagram of an inverter included in the first driver 265 illustrated in FIG. 6. Referring to FIG. 7, the inverter includes a PMOS transistor PM and an NMOS transistor NM.

The PMOS transistor PM includes a source connected to the bias voltage VB, a gate to which a first bit REG1<0> of the first register signal REG1 is input, and a drain to output the driver control signal Vpb<0>. The NMOS transistor NM includes a source connected to a ground voltage VSS, a gate to which a first bit REG1<0> of the first register signal REG1 is input, and a drain to output the driver control signal Vpb<0>.

Similarly, the remaining bits REG<1:11> of the first register signal REG1 are input to inverters having the same configuration as the configuration of the inverter shown in FIG. 7 to generate the driver control signals Vpb<1:5> and Vnb<0:5>.

Referring to FIG. 6, the second driver 266 generates termination control signals [Vpp, Vpn, and Vppn] and [Vp, Vn, and Vpn] in response to the second register signal REG2 and the bias voltage VB. The second driver 266 may include a plurality of inverters. Since the configuration of each of the inverters in the second driver 266 may be the same as the configuration of the inverter shown in FIG. 7, a further description of the configuration of an inverter will be omitted.

FIG. 8 is a table indicating signaling systems corresponding to combinations of the control signals of the pre-driver unit and the main driver unit illustrated in FIG. 4.

Referring to FIG. 8, logic high H and logic low L signals which are input to the NMOS transistor included in each of the pre-driver unit 201 and the main driver unit 203 indicate a bias voltage which can satisfy a predetermined saturation condition and a ground voltage VSS. Logic low L and logic high H signals which are input to the PMOS transistor included in each of the pre-driver unit 201 and the main driver unit 203 indicate a bias voltage which can satisfy a predetermined saturation condition and a power supply voltage VDD. X indicates that the logic level of the signal has no effect.

Referring to FIG. 8, TMDS, LVDS, HVDS, high voltage differential signaling (H_HVDS), and low voltage differential signaling L_HVDS are illustrated as signaling systems for communicating with an external apparatus.

FIGS. 9A-9D are graphs that include a series of waveforms having different magnitudes. Because the graphs are only intended to convey general characteristics of the signaling system of output signals in the various modes of the above-described embodiments, the exact values of these magnitudes are not important. Moreover, one skilled in the art will understand the graphs of FIGS. 9A-9D and how they apply to these embodiments.

Figure 9A:
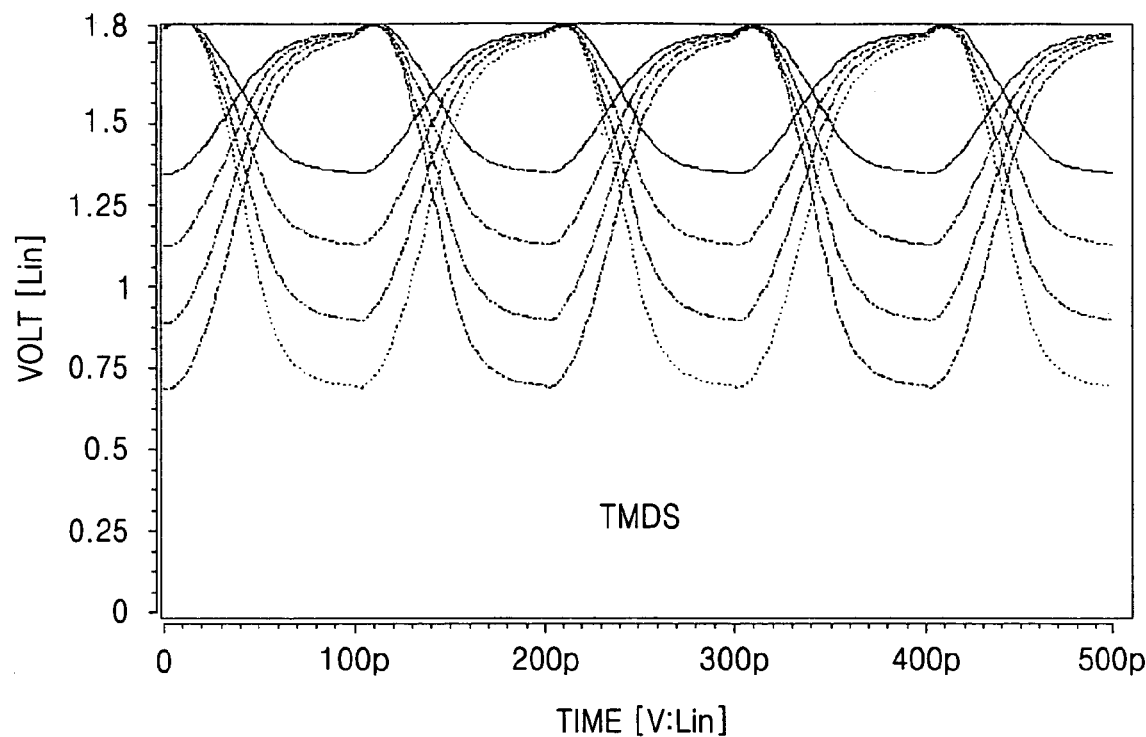
FIG. 9A is a graph of a case in which the signaling system of an output signal having a transfer rate of 10 Gbps is a TMDS.

The TMDS is set when the combinations of the first termination control signals [Vpp, Vpn, and Vppn] and second termination control signals [Vp, Vn, and Vpn] are both LLH. In this case, the common mode level and the amplitude of the TMDS are determined by a combination of the driver control signals Vpb<3:5>, Vnb<3:5>, Vpb<0:2>, and Vnb<0:2>. FIG. 9A is a graph illustrating a ease in which the signaling system of an output signal having a transfer rate of 10 Gbps is in the TMDS mode.

Figure 9B:
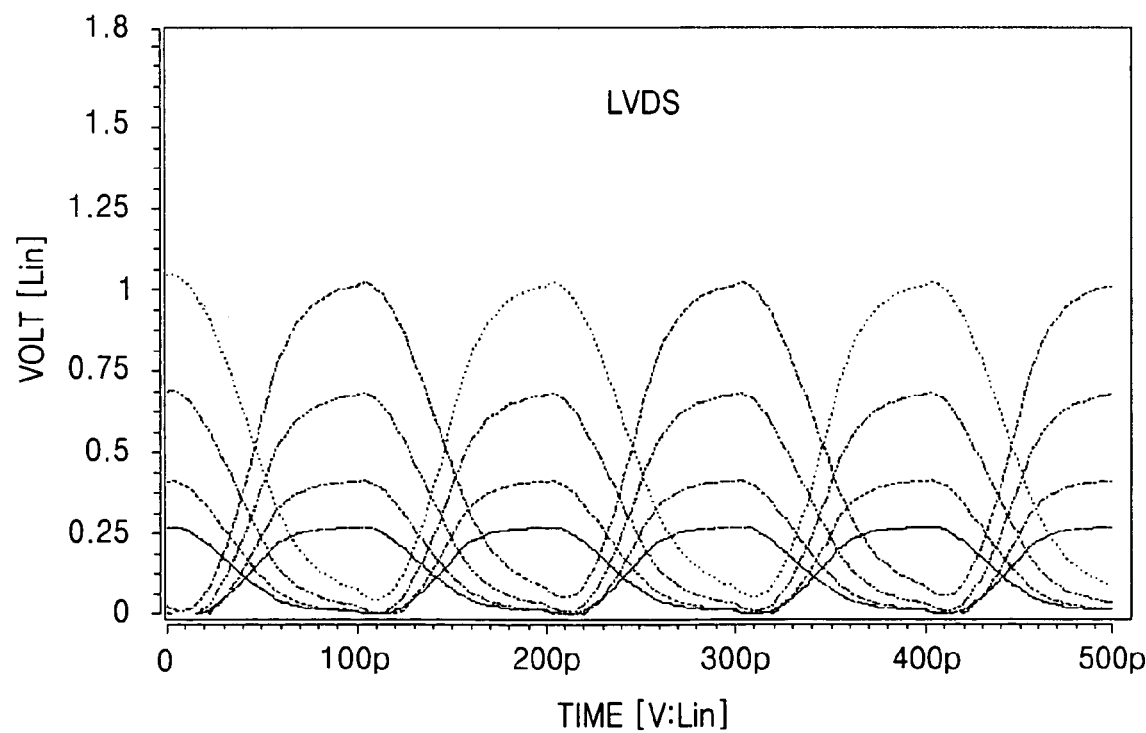
FIG. 9B is a graph of a case in which the signaling system of an output signal having a transfer rate of 10 Gbps is an LVDS.

The LVDS is set when the combination of the first termination control signals Vpp, Vpn, and Vppn is LHL and the combination of the second termination signals Vp, Vn, and Vpn is HHH. In this case, the common mode level and the amplitude of the LVDS are determined by the combination of the driver control signals Vpb<3:5>, Vnb<3:5>, Vpb<0:2>, and Vnb<0:2>. FIG. 9B is a graph illustrating a case in which the signaling system of an output signal having a transfer rate of 10 Gbps is in the LVDS mode.

Figure 9C:
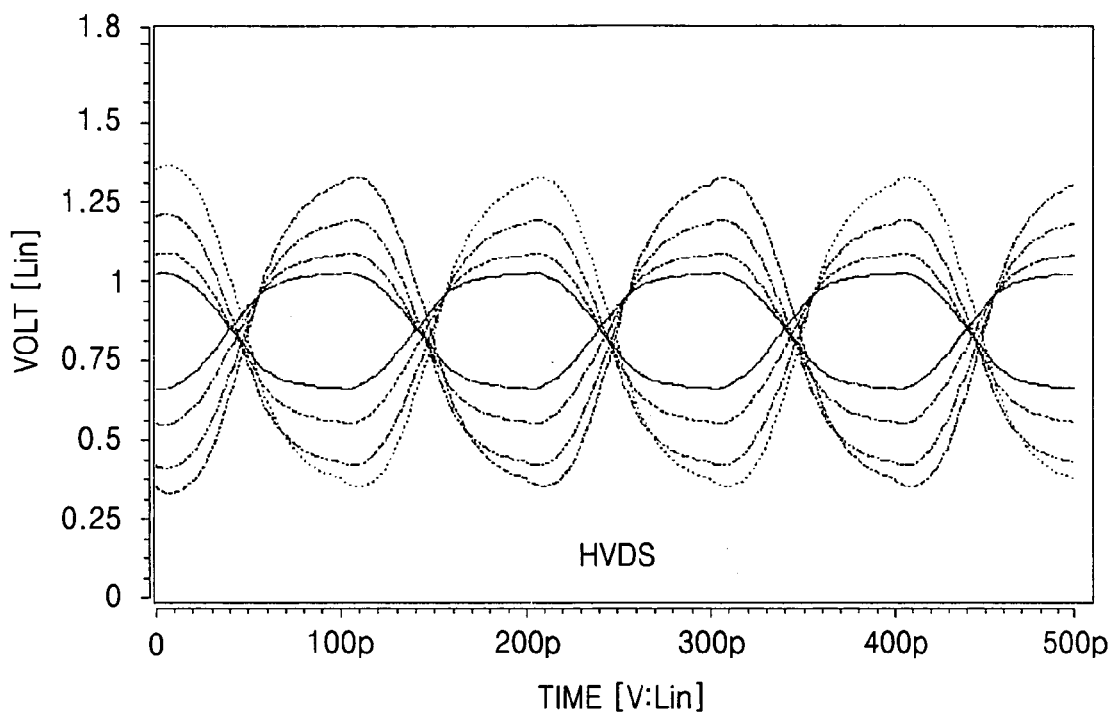
FIG. 9C is a graph of a case in which the signaling system of an output signal having a transfer rate of 10 Gbps is an HVDS.

The HVDS is set when the combinations of the first and second termination signals [Vpp, Vpn, and Vppn] and [Vp, Vn, and Vpn] are both LHL. In this case, the common mode level and the amplitude of the HVDS are determined by the combination of the driver control signals Vpb<3:5>, Vnb<3:5>, Vpb<0:2>, and Vnb<0:2>. FIG. 9C is a graph illustrating a case in which the signaling system of an output signal having a transfer rate of 10 Gbps is in the HVDS mode.

The H_HVDS is set when the combinations of the first and second termination control signals [Vpp, Vpn, and Vppn] and [Vp, Vn, and Vpn] are both LHL. In this case, the common mode level and the amplitude of the H_HVDS are determined by the combination of the driver control signals Vpb<3:5>, Vnb<3:5>, Vpb<0:2>, and Vnb<0:2>. The common mode level of the H_HVDS is greater than VDD/2.

Figure 9D:
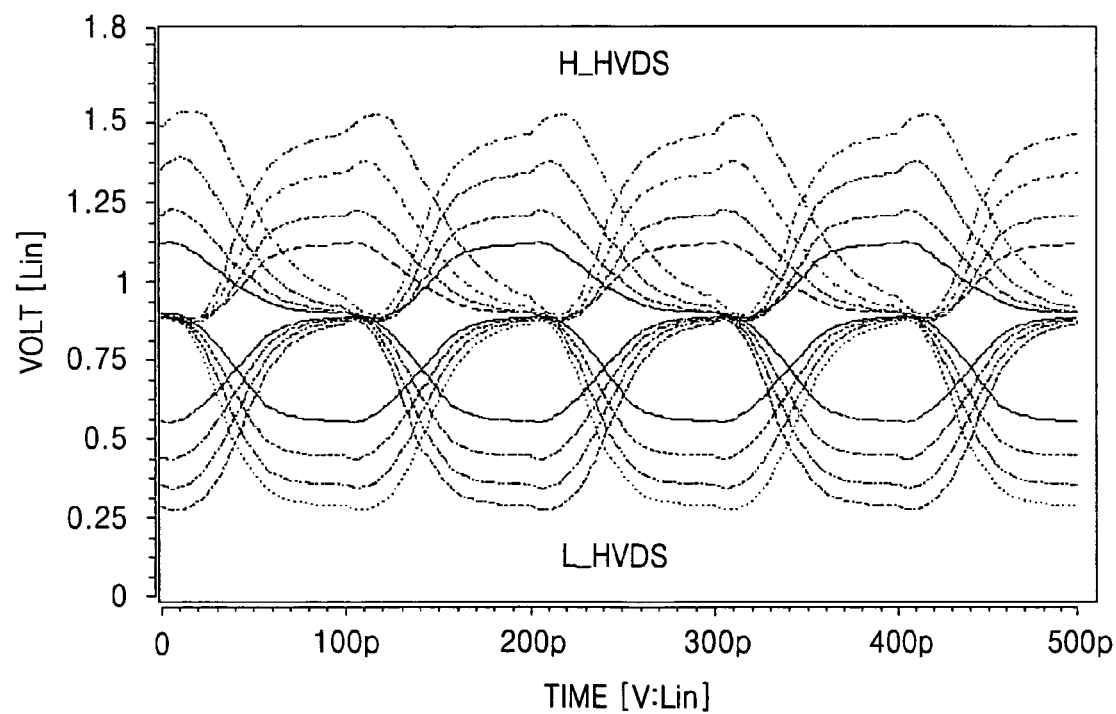
FIG. 9D is a graph of a case in which the signaling system of output signals having a transfer rate of 10 Gbps are H_HVDS and L_HVDS.

The L_HVDS is set when the combinations of the first and second termination control signals [Vpp, Vpn, and Vppn] and [Vp, Vn, and Vpn] are both LHL. In this case, the common mode level and the amplitude of the L_HVDS are determined by the combination of the driver control signals Vpb<3:5>, Vnb<3:5>, Vpb<0:2>, and Vnb<0:2>. The common mode level of the L_HVDS is less than VDD/2. FIG. 9D is a graph illustrating a case in which the signaling system of an output signal having a transfer rate of 10 Gbps are in H_HVDS and L_HVDS modes.

Figure 10:
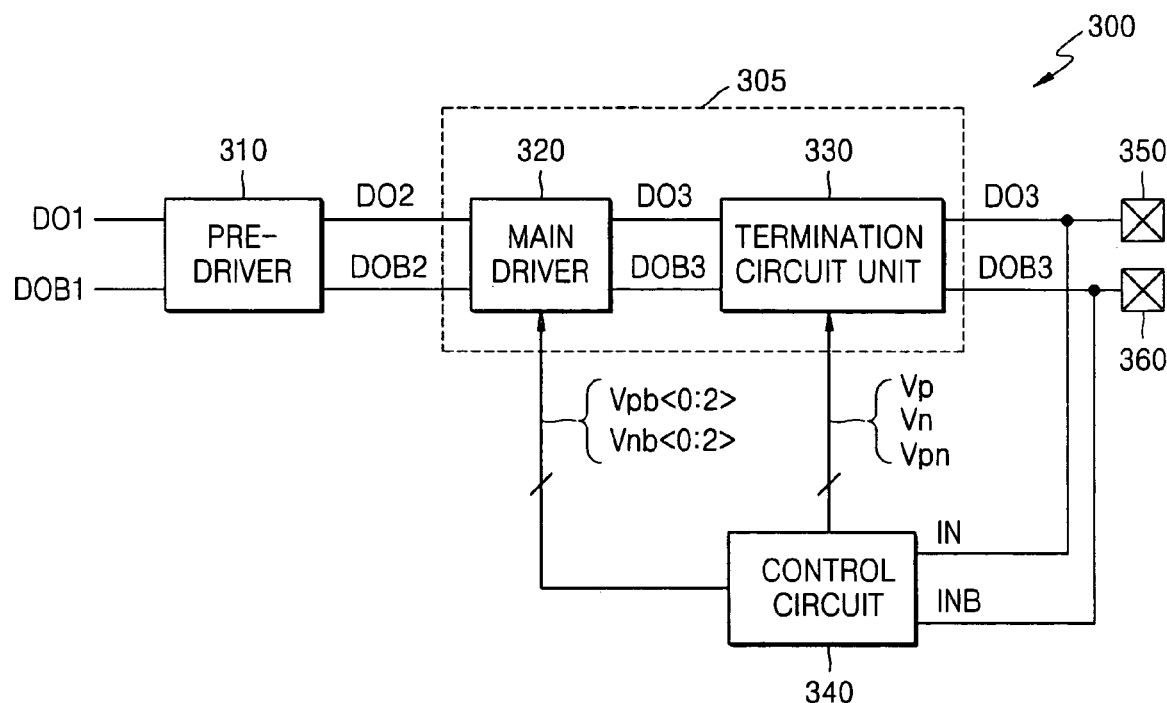
FIG. 10 is a block diagram of a transmitter of a semiconductor device according to another embodiment of the present invention.

FIG. 10 is a block diagram of a transmitter 300 of a semiconductor device according to another embodiment of the present invention.

Referring to FIG. 10, the transmitter 300 includes a pre-driver 310, a main driver 320, a termination circuit unit 330, and a control circuit 340. The transmitter 300 may be one of the I/O circuits of a semiconductor device 140 of FIG. 1. On the other hand, the transmitter 300 may be a transmitter included in a memory device such as DRAM.

The control circuit 340 detects the common mode level and the amplitude of differential input mode signals IN and INB inputted via DQ pads 350 and 360 and generates driver control signals Vpb<0:2> and Vnb<0:2> and termination control signals Vp, Vn, and Vpn.

The signaling system of input mode signals may be TMDS, HVDS, or LVDS. In response to the driver control signals Vpb<0:2> and Vnb<0:2> and the termination control signals Vp, Vn, and Vpn control, the common mode level and the amplitude of output signals DO3 and DOB3 are identical to the common mode level and the amplitude of the corresponding input mode signals IN and INB.

In the present embodiment, the number of the driver control signals Vpb<0:2> and Vnb<0:2> is 6 and the number of the termination control signals Vp, Vn, and Vpn is 3. However, if a signaling system of the input mode signals IN and INB is added, the number of the driver control signals and the number of the termination control signals are increased. For example, an additional signaling system may be RSL.

Since the configuration of the control circuit 340 is the same as the configuration of the control circuit 260 of FIG. 6, a detailed description of the configuration of the control circuit 340 will be omitted.

The pre-driver 310 converts first internal output signals DO1 and DOB1 into second internal output signals DO2 and DOB2. The first internal output signals DO1 and DOB1 and second internal output signals DO2 and DOB2 are differential signals. The first internal output signals DO1 and DOB1 can have a small amplitude swing about the common mode level near under a power supply voltage VDD.

Figure 11:
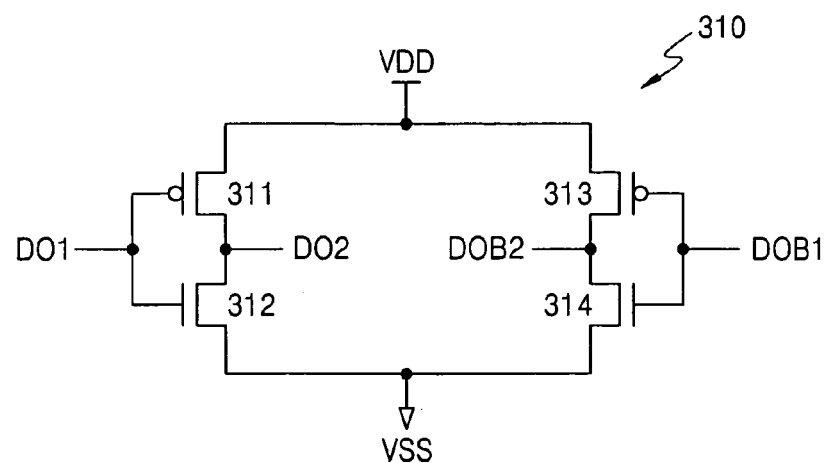
FIG. 11 is a circuit diagram of a pre-driver shown in FIG. 10.

FIG. 11 is a circuit diagram of the pre-driver 310 of FIG. 10. Referring to FIG. 11, the pre-driver 310 includes PMOS transistors 311 and 313 and NMOS transistors 312 and 314. The power supply voltage VDD is connected to sources of the PMOS transistors 311 and 313, and a ground voltage VSS is connected to sources of the NMOS transistors 312 and 314. The power supply voltage VDD may be, for example, 1.8 V.

The first internal output signal DO1 is input to gates of the PMOS transistor 311 and the NMOS transistor 312, and the complementary signal DOB1 of the first internal output signal DO1 is input to gates of the PMOS transistor 313 and the NMOS transistor 314. The second internal output signal DO2 is output from a node between the PMOS transistor 311 and the NMOS transistor 312. The complementary signal DOB2 of the second internal output signal DO2 is output from a node between the PMOS transistor 313 and the NMOS transistor 314.

Referring to FIG. 10, a main driver unit 305 comprises the main driver 320 and the termination circuit unit 330.

In response to the driver control signals Vpb<0:2> and Vnb<0:2>, the main driver 320 modifies the common mode level and the amplitude of the second internal output signals DO2 and DOB2, thereby generating the output signals DO3 and DOB3. The output signals DO3 and DOB3 are differential signals. The output signals DO3 and DOB3 are output to external apparatuses via the DQ pads 350 and 360. The external apparatus may be first and second circuit blocks 110 and 160 of FIG. 1.

Since the configuration of the main driver 320 is the same as the configuration of the main driver 240 of FIG. 4, a detailed description of the configuration of the main driver 320 will be omitted.

The termination circuit unit 330 sets a termination voltage supplied to signal lines transferring the output signals DO3 and DOB3 in response to the termination control signals Vp, Vn, and Vpn. The termination voltage may be VDD, VDD/2, or VSS. Since the configuration of the termination circuit unit 330 is the same as the configuration of the second termination circuit unit 250 of FIG. 4, a detailed description of the configuration of the termination circuit unit 330 will be omitted.

The main driver unit 305 sets a voltage gain of the main driver 320 to control the common mode level and the amplitude of the output signals DO3 and DOB3 to satisfy the signaling systems of the external apparatuses.

For example, when the external apparatus is an XDR DRAM using TMDS, the main driver unit 305 is set to TMDS. When the external apparatus is a DDR DRAM using HVDS, the main driver unit 305 is set to HVDS. When the external apparatus uses LVDS, the main driver unit 305 is set to LVDS.

While the present invention has been particularly shown and described with reference to exemplary embodiments thereof, it will be understood by those of ordinary skill in the art that various modifies in form and details may be made therein without departing from the spirit and scope of the present invention as defined by the following claims.

What is claimed is:

1. A transmitter of a semiconductor device, the transmitter comprising:
    a pre-driver unit to modify a common mode level and an amplitude of a first internal output signal to generate a second internal output signal in response to a first driver control signal and a first termination control signal;
    a main driver unit to modify a common mode level and an amplitude of the second internal output signal to generate an output signal in response to a second driver control signal and a second termination control signal; and
    a control circuit to detect a common mode level and an amplitude of an input mode signal corresponding to the output signal to generate the first and second driver control signals and the first and second termination control signals,
    wherein a common mode level and an amplitude of the output signal are the same as the common mode level and the amplitude of the input mode signal.

2. The transmitter of claim 1, wherein the first internal output signal, the second internal output signal, the output signal, and the input mode signal are differential signals.

3. The transmitter of claim 1, wherein the input mode signal and the output signal are one of transition minimized differential signaling (TMDS), half voltage differential signaling (HVDS), low voltage differential signaling (LVDS), and a rambus signal level (RSL).

4. The transmitter of claim 2, wherein the pre-driver unit comprises:
    a pre-driver to convert the first internal output signal into the second internal output signal in response to the first driver control signal; and
    a first termination circuit unit to set a termination voltage supplied to a signal line that transmits one of the second internal output signal in response to the first termination control signal.

5. The transmitter of claim 4, wherein the pre-driver comprises:
    an output unit to invert the first internal output signal to generate the second internal output signal;
    a complementary output unit to invert a complementary signal of the first internal output signal to generate a complementary signal of the second internal output signal;
    a pull-up transistor unit to supply one of a power supply voltage and a first voltage less than the power supply voltage to the output unit and the complementary output unit in response to a pull-up signal included in the first driver control signal; and
    a pull-down transistor unit to supply one of a ground voltage and a second voltage greater than the ground voltage to the output unit and the complementary output unit in response to a pull-down signal included in the first driver control signal.

6. The transmitter of claim 5, wherein the pull-up transistor unit comprises PMOS transistors, each including a source to which the power supply voltage is applied and a gate to which the pull-up signal is input.

7. The transmitter of claim 5, wherein the pull-down transistor unit comprises NMOS transistors, each including a source to which the ground voltage is applied and a gate to which the pull-down signal is input.

8. The transmitter of claim 4, wherein the termination voltage is one of a power supply voltage, ½ of the power supply voltage, and a ground voltage.

9. The transmitter of claim 8, wherein the first termination circuit unit comprises:
    a first termination circuit to supply the termination voltage to a signal line that transmits the second internal output signal via a termination resistor in response to the first termination control signal; and
    a first complementary termination circuit to supply the termination voltage to a signal line that transmits a complementary signal of the second internal output signal via the termination resistor in response to the first termination control signal.

10. The transmitter of claim 9, wherein the first termination circuit comprises:
    an NMOS transistor including a source to which the ground voltage is applied and a gate to which the first termination control signal is input;
    a first PMOS transistor including a source to which ½ of the power supply voltage is applied and a gate to which the first terminal control signal is input; and
    a second PMOS transistor including a source to which the power supply voltage is applied and a gate to which the first termination control signal is input,
    wherein the termination resistor is connected between a node connecting drains of the NMOS transistor, the first PMOS transistor, and the second PMOS transistor, and the signal line that transmits the second internal output signal.

11. The transmitter of claim 9, wherein the first complementary termination circuit comprises:
    an NMOS transistor including a source to which the ground voltage is applied and a gate to which the first termination control signal is input;
    a first PMOS transistor including a source to which ½ of the power supply voltage is applied and a gate to which the first termination control signal is input; and
    a second PMOS transistor including a source to which the power supply voltage is applied and a gate to which the first termination control signal is input,
    wherein the termination resistor is connected between a node connecting drains of the NMOS transistor, the first PMOS transistor and the second PMOS transistor, and the signal line that transmits the complementary signal of the second internal output signal.

12. The transmitter of claim 2, wherein the main driver unit comprises:
    a main driver to convert the second internal output signal into the output signal in response to the second driver control signal; and a second termination circuit unit to set a termination voltage supplied to a signal line that transmits the output signal in response to the second termination control signal.

13. The transmitter of claim 12, wherein the main driver comprises:
an output unit to invert the second internal output signal to generate the output signal;
a complementary output unit to invert a complementary signal of the second internal output signal to generate a complementary signal of the output signal;
a pull-up transistor unit to supply one of a power supply voltage and a first voltage less than the power supply voltage to the output unit and the complementary output unit in response to a pull-up signal included in the second driver control signal; and
a pull-down transistor unit to supply one of a ground voltage and a second voltage greater than the ground voltage to the output unit and the complementary output unit in response to a pull-down signal included in the second driver control signal.

14. The transmitter of claim 13, wherein the pull-up transistor unit comprises PMOS transistors, each including a source to which the power supply voltage is applied and a gate to which the pull-up signal is input.

15. The transmitter of claim 13, wherein the pull-down transistor unit comprises NMOS transistors, each including a source to which the ground voltage is applied and a gate to which the pull-down signal is input.

16. The transmitter of claim 12, wherein the termination voltage is one of a power supply voltage, ½ of the power supply voltage, and a ground voltage.

17. The transmitter of claim 16, wherein the first termination circuit unit comprises:
a first termination circuit to supply the termination voltage to a signal line that transmits the output signal via a termination resistor in response to the second termination control signal; and
a complementary termination circuit to supply the termination voltage to a signal line that transmits a complementary signal of the output signal via the termination resistor in response to the second termination control signal.

18. The transmitter of claim 17, wherein the first termination circuit comprises:
an NMOS transistor including a source to which the ground voltage is applied and a gate to which the second termination control signal is input;
a first PMOS transistor including a source to which ½ of the power supply voltage is applied and a gate to which the second termination control signal is input; and
a second PMOS transistor including a source to which the power supply voltage is applied and a gate to which the second termination control signal is input,
wherein the termination resistor is connected between a node connecting drains of the NMOS transistor, the first PMOS transistor and the second PMOS transistor, and the signal line that transmits the output signal.

19. The transmitter of claim 17, wherein the first complementary termination circuit comprises:
an NMOS transistor including a source to which the ground voltage is applied and a gate to which the second termination control signal is input;
a first PMOS transistor including a source to which ½ of the power supply voltage is applied and a gate to which the second termination control signal is input; and
a second PMOS transistor including a source to which the power supply voltage is applied and a gate to which the second termination control signal is input,
wherein the termination resistor is connected between a node connecting drains of the NMOS transistor, the first PMOS transistor and the second PMOS transistor, and the signal line that transmits the complementary signal of the output signal.

20. The transmitter of claim 2, wherein the control circuit comprises:
a detector to detect the common mode level and the amplitude of the input mode signal to generate a register signal having a first portion of bits and a second portion of bits;
a driver register to store the first portion of bits as a first register signal;
a mode register to store the second portion of bits as a second register signal;
a voltage generator to generate a predetermined bias voltage;
a first driver to generate the first and the second driver control signals in response to the first register signal and the bias voltage; and
a second driver to generate the first and the second termination control signals in response to the second register signal and the bias voltage.

21. The transmitter of claim 20, wherein the voltage of the first driver control signal, the second driver control signal, the first termination control signal, and the second termination control signal are each adapted to drive a PMOS or an NMOS transistor into saturation.

22. The transmitter of claim 20, wherein the first driver comprises a plurality of inverters.

23. The transmitter of claim 20, wherein the second driver comprises a plurality of inverters.

24. A transmitter of a semiconductor device, the transmitter comprising:
a pre-driver to convert first internal output signals into second internal output signals;
a main driver unit to modify a common mode level and an amplitude of the second internal output signals to generate output signals in response to driver control signals and termination control signals; and
a control circuit to detect a common mode level and an amplitude of input signals corresponding to the output signals to generate the driver control signals and the termination control signals,
wherein a common mode level and an amplitude of the output signals are the same as the common mode level and the amplitude of the input signals.

25. The transmitter of claim 24, wherein the first internal output signals, the second internal output signals, the output signals, and the input signals are differential signals.

26. The transmitter of claim 24, wherein the input signals and the output signals are one of transition minimized differential signaling (TMDS), half voltage differential signaling (HVDS), low voltage differential signaling (LVDS), and a rambus signal level (RSL).

27. The transmitter of claim 25, wherein the main driver unit comprises:
a main driver to convert the second internal output signals into the output signals in response to the driver control signals; and
a termination circuit unit to set a termination voltage supplied to signal lines that transmit the output signals in response to the termination control signals.

28. The transmitter of claim 27, wherein the main driver comprises:
  an output unit to invert the second internal output signal to generate the output signal;
  a complementary output unit to invert a complementary signal of the second internal output signal to generate a complementary signal of the output signal;
  a pull-up transistor unit to supply one of a power supply voltage and a first voltage less than the power supply voltage to the output unit and the complementary output unit in response to pull-up signals included in the driver control signals; and
  a pull-down transistor unit supplies one of a ground voltage and a second voltage greater than the ground voltage to the output unit and the complementary output unit in response to pull-down signals included in the driver control signals.

29. The transmitter of claim 28, wherein the pull-up transistor unit comprises three PMOS transistors, each including a source to which the power supply voltage is applied and a gate to which one of the pull-up signals is input.

30. The transmitter of claim 28, wherein the pull-down transistor unit comprises three NMOS transistors, each including a source to which the ground voltage is applied and a gate to which one of the pull-down signals is input.

31. The transmitter of claim 27, wherein the termination voltage is one of a power supply voltage, ½ of the power supply voltage, and a ground voltage.

32. The transmitter of claim 31, wherein the termination circuit unit comprises:
  a termination circuit to supply the termination voltage to a signal line that transmits the output signal via a termination resistor in response to the termination control signals; and
  a complementary termination circuit to supply the termination voltage to a signal line that transmits a complementary signal of the output signal via the termination resistor in response to the termination control signals.

33. The transmitter of claim 32, wherein the first termination circuit comprises:
  an NMOS transistor including a source to which the ground voltage is applied and a gate to which one of the termination control signals is input;
  a first PMOS transistor including a source to which ½ of the power supply voltage is applied and a gate to which one of the termination control signals is input; and
  a second PMOS transistor including a source to which the power supply voltage is applied and a gate to which one of the termination control signals is input,
  wherein the termination resistor is connected between a node connecting drains of the NMOS transistor, the first PMOS transistor, and the second PMOS transistor, and the signal line that transmits the output signal.

34. The transmitter of claim 32, wherein the first complementary termination circuit comprises:
  an NMOS transistor including a source to which the ground voltage is applied and a gate to which one of the termination control signals is input;
  a first PMOS transistor including a source to which ½ of the power supply voltage is applied and a gate to which one of the termination control signals is input; and
  a second PMOS transistor including a source to which the power supply voltage is applied and a gate to which one of the termination control signals is input,
  wherein the termination resistor is connected between a node connecting drains of the NMOS transistor, the first PMOS transistor and the second PMOS transistor, and the signal line that transmit the complementary signal of the output signal.

35. The transmitter of claim 25, wherein the control circuit comprises:
  a detector to detect the common mode level and the amplitude of the input signals to generate a register signal;
  a driver register to store some bits of the register signal as a first register signal;
  a mode register to store the remaining bits of the register signal as a second register signal;
  a voltage generator to generate a predetermined bias voltage;
  a first driver to generate the first and the second driver control signals in response to the first register signal and the bias voltage; and
  a second driver to generate the first and the second termination control signals in response to the second register signal and the bias voltage.

36. The transmitter of claim 35, wherein the voltages of the driver control signals and termination control signals are adapted to drive a PMOS or an NMOS transistor into a saturation mode.

37. The transmitter of claim 35, wherein the first driver comprises a plurality of inverters.

38. The transmitter of claim 35, wherein the second driver comprises a plurality of inverters.

39. A method of transmitting a signal of a semiconductor device:
  converting a first internal output signal into a second internal output signals;
  modifying a common mode level and an amplitude of the second internal output signal to generate output signals in response to driver control signals and termination control signals; and
  detecting a common mode level and an amplitude of input signals corresponding to the output signals to generate the driver control signals and the termination control signals,
  wherein a common mode level and an amplitude of the output signals are the same as the common mode level and the amplitude of the input signals.

* * * * *

UNITED STATES PATENT AND TRADEMARK OFFICE
CERTIFICATE OF CORRECTION

PATENT NO. : 7,301,371 B2  Page 1 of 1
APPLICATION NO. : 11/221282
DATED : November 27, 2007
INVENTOR(S) : Jin-Hyun Kim It is certified that error appears in the above-identified patent and that said Letters Patent is hereby corrected as shown below:

Column 5, line 30, the word "Vnb<4," should read -- Vnb<4>, --;
Column 9, line 15, the word "ease" should read -- case --.

Signed and Sealed this

Seventh Day of October, 2008

JON W. DUDAS
*Director of the United States Patent and Trademark Office*